United States Patent
Vickes

(10) Patent No.: US 9,947,984 B2
(45) Date of Patent: Apr. 17, 2018

(54) POWER DIVIDER AND POWER COMBINER

(71) Applicant: SAAB AB, Linköping (SE)

(72) Inventor: Hans-Olof Vickes, Särö (SE)

(73) Assignee: SAAB AB, Linköping (SE)

( * ) Notice: Subject to any disclaimer, the term of this patent is extended or adjusted under 35 U.S.C. 154(b) by 116 days.

(21) Appl. No.: 15/104,029

(22) PCT Filed: Dec. 13, 2013

(86) PCT No.: PCT/SE2013/051511
§ 371 (c)(1),
(2) Date: Jun. 13, 2016

(87) PCT Pub. No.: WO2015/088413
PCT Pub. Date: Jun. 18, 2015

(65) Prior Publication Data
US 2016/0365617 A1    Dec. 15, 2016

(51) Int. Cl.
*H01Q 1/50* (2006.01)
*H01P 5/12* (2006.01)
*H03H 7/48* (2006.01)
*H01Q 1/24* (2006.01)
*H01Q 1/38* (2006.01)
(Continued)

(52) U.S. Cl.
CPC ........... *H01P 5/12* (2013.01); *H01P 5/16* (2013.01); *H01Q 1/24* (2013.01); *H01Q 1/38* (2013.01); *H03H 7/46* (2013.01); *H03H 7/48* (2013.01)

(58) Field of Classification Search
CPC .............. H01Q 1/50; H01P 5/12; H01P 5/16
See application file for complete search history.

(56) References Cited

U.S. PATENT DOCUMENTS

| 4,367,445 A | 1/1983 | Dydyk |
| 4,875,024 A | 10/1989 | Roberts |

(Continued)

FOREIGN PATENT DOCUMENTS

CN    103259072 A    8/2013

OTHER PUBLICATIONS

Extended European Search Report dated Jul. 21, 2017 in Application No. 13899198.9.

(Continued)

*Primary Examiner* — Hoang Nguyen
(74) *Attorney, Agent, or Firm* — Venable LLP; Jeffri A. Kaminski

(57) ABSTRACT

A power circuit suitable for combining or splitting broadband signals. The circuit includes a stepped impedance section, a core section and a first, second and third port. The stepped impedance section and the core section are interconnected at an interconnection. The stepped impedance section includes a first transmission line running from the first port to the interconnection. The core section includes a second and a third transmission line running from the interconnection to the second and third ports, respectively. The second and third transmission lines each have at least a first and a second core subsection. The number of core subsections of the second transmission line and the number of core subsections of the third transmission line is equal, to the number of stepped impedance subsections of the stepped impedance section.

20 Claims, 3 Drawing Sheets

(51) Int. Cl.
*H03H 7/46* (2006.01)
*H01P 5/16* (2006.01)

(56) References Cited

U.S. PATENT DOCUMENTS

| 4,885,557 | A | * | 12/1989 | Barczys | ............... | H03H 7/48 |
| | | | | | | 333/124 |
| 8,570,116 | B2 | * | 10/2013 | Podell | ................ | H01P 5/12 |
| | | | | | | 333/127 |
| 2008/0150832 | A1 | | 6/2008 | Ingram et al. | | |
| 2009/0295500 | A1 | | 12/2009 | Ives | | |

OTHER PUBLICATIONS

Robert E. Collin, "Foundations for Microwave Engineering" Second Edition, McGraw-Hill, Inc., XP002771489, 1992, pp. 348, 349, 370 and 371.
Ernest J. Wilkinson—"An N-Way Hybrid Power Divider"; IRE Transactions on Microwave Theory and Techniques; Jan. 1960; pp. 116-118.
PCT/ISA/210—International Search Report—dated Jul. 1, 2014 (Issued in PCT/SE2013/051511).
PCT/ISA/237—Written Opinion of the International Searching Authority—dated Jul. 1, 2014 ( (Issued in PCT/SE2013/051511).
PCT/IPEA/409—International Preliminary Report on Patentability—dated Nov. 19, 2015 ( (Issued in PCT/SE2013/051511).
Seymor B. Cohn; "A Class of Broadband Three-Port TEM-Mode Hybrids" in: IEEE Transactions on Microwave Theory and Techniques, vol. 16, Issue 2, Feb. 1968, pp. 110-116, ISSN 0018.
Seymor B. Cohn; "Optimum Design of Stepped Transmission-Line Transformers" in: IRE Transactions on Microwave Theory and Techniques, vol. 3, Issue 3, Apr. 1955, pp. 16-20, ISSN 0097-2002.
L. Young; "Tables for Cascaded Homogeneous Quarter-Wave Transformers" in: IRE Transactions on Microwave Theory and Techniques, vol. 7, Issue 2, Apr. 1959, pp. 233-237, ISSN 0097-2002.
L. I. Parad et al.; "Split-Tee Power Divider" in: IEEE Transactions on Microwave Theory and Techniques, vol. 13, Issue 1, Jan. 1965, pp. 91-95, ISSN 0018-9480.
J. S. Chieh et al.; "Development of a broadband Wilkinson Power Combiner on Liquid Crystal Polymer" in: Proceedings of Microwave Conference, 2009 (APMC 2009), Dec. 7-10, 2009, Singapore, pp. 2068-2071, E-ISBN 978-1-4244-2802-1.

* cited by examiner

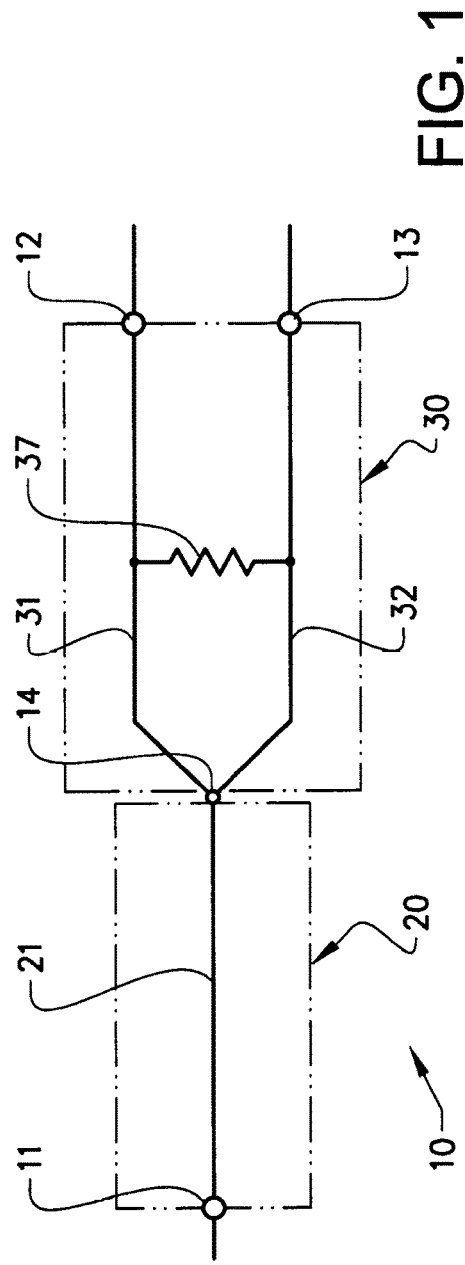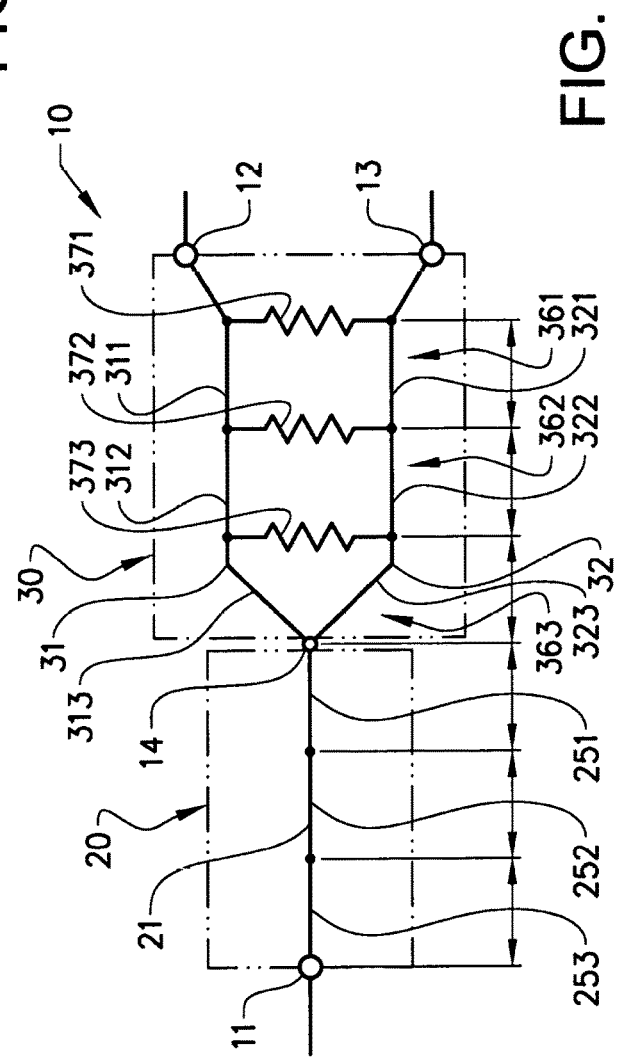

POWER DIVIDER AND POWER COMBINER

CROSS-REFERENCE TO RELATED APPLICATIONS

The application is the national phase under 35 U.S.C. § 371 of PCT/SE2013/051511 filed 13 Dec. 2013.

TECHNICAL FIELD

The invention relates to a device for splitting or combining broadband signals, through a power circuit that can be used as a power divider or power combiner comprising two distinct sections dividing one transmission line into two transmission lines or combining two transmission lines into one transmission line. The power circuit is especially suitable for microwave and millimeter-wave circuitry such as e.g. power amplifiers, phase-array antennas, mixers and active circulators.

BACKGROUND ART

Power dividers and power combiners, also known as power splitters are passive devices used to divide or combine the amount of electromagnetic power in a transmission line to which the device is connected. Power circuits such as power dividers and power combiners are useful for distributing power among various paths and are of importance in a wide array of electronic equipment such as power amplifiers, phase-array antennas, mixers and active circulators. They can also be used to measure or monitor feeds to and from antennae, or used in cable television or telephone lines.

There are many known power divider/combiner designs, and one commonly employed, especially at frequencies above 500 MHz, is one commonly referred to as a Wilkinson Power Divider, described in "An N-way Power Divider" by E. Wilkinson, IEEE Transactions on Microwave Theory and Techniques, MTT-8, No. 1, January 1960, pages 116-118. The common Wilkinson power divider comprises two transmission lines running from an inport to two outports. The transmission lines are connected by an isolating resistor.

The Wilkinson power divider has numerous advantages over other power dividers, such as being constructed out of passive components, making it reciprocal, allowing it to be used as a power combiner as well. Further, the design allows for a high degree of isolation between ports, which may be crucial during certain implementations. The Wilkinson power divider is further lossless to a very high degree.

For applications requiring a larger bandwidth, a development of the Wilkinson power divider is often employed, called a multisection Wilkinson divider in which, after the first isolating resistor, additional impedances are deployed on both transmission lines, as well as another isolating resistor connecting them, or equivalent structures.

Depending on the application or the frequencies used, such a Wilkinson power divider can become relatively large. In various applications where space is at a very high premium, implementing such a Wilkinson power divider or a similar power combiner may then prove difficult or impossible.

There is thus room for an improved power circuit that can be used as a power divider or power combiner.

SUMMARY OF THE INVENTION

An object of the present disclosure is to provide an improved power divider and/or power combiner.

The object of the invention is achieved by a power circuit. This power circuit comprises a stepped impedance section and a core section, said stepped impedance section and said core section being connected by an interconnection. The power circuit has a first, a second and a third port. The stepped impedance section comprises the first port and a first transmission line running from said first port to the interconnection. The core section comprises the second port and the third port, and a second transmission line running from said interconnection to the second port and a third transmission line running from the interconnection to the third port. The second and third transmission lines each have at least a first and a second core subsection. The second and third transmission lines have an equal number of core subsections, each core subsection having an impedance. The core subsections form pairs of core subsections, where the first pair of core subsections comprises the first core subsection of the second transmission line and the first core subsection of the third transmission line and the second pair of core subsections comprises the second core subsection of the second transmission line and the second core subsection of the third transmission line. Each pair of core subsections further comprise resistance means connecting said second and third transmission lines. The power circuit is characterised in that the first transmission line comprises at least two stepped impedance subsections; where the impedance of the transmission fine in each of the at least two stepped impedance subsections differs; the impedances of each core subsection of the second and third transmission lines are equal; the resistance of each of the resistance means connecting the second and third transmission lines in each pair of core subsections also differs, and the number of stepped impedance subsections of the stepped impedance section and the number of pairs of core subsections of the core section is equal.

A power circuit according to the invention reduces the associated impedances of the transmission lines near the excitation RF-port. This means that the amount of dielectric or other insulating agents of the circuit can be reduced, as there is less need for isolation. This allows the size of the power circuit to be reduced. Alternatively, this allows more power and/or higher bandwidths to be used with the power circuit without an increase in the size of the power circuit. This allows the power circuit to be used in applications where space is at a premium, and where conventionally designed power circuits are too large. In complex systems, the amount of components can be very large, and thus even a small improvement in size can result in noticeable improvements, especially true for multilayer arrangements.

In one development of the invention, the impedances of the stepped impedance subsections of the stepped impedance section decrease stepwise from the first port towards the interconnection.

In one development of the invention, the impedances of the stepped impedance subsections is lower than the port impedances of the first, second and third ports. In yet another development of the invention, the impedances of the stepped impedance subsections is greater than half of the port impedances of the first, second and third ports.

In one development of the invention, the number of stepped impedance subsections of the stepped impedance subsection and the number of pairs of core subsections of the core section are equal to three.

In one development of the invention, the impedances of the core subsections are equal to 50 Ohms. In a further development of the invention, the impedances of the core subsections are equal to the port impedances of the first, second and third ports. Setting the transmission line impedances to 50 Ohms allows the power circuit to be used in 50 Ohm systems without requiring too much modification of the signal. Preferably, the circuit has even power split, with a coupling factor of −3.0 dB.

Preferably, the signals to be combined or divided by the power circuit are broadband signals that have a frequency in the range between 4 GHz to 20 GHz. In one embodiment of the invention, the power circuit is implemented as a stripline or microstrip. The invention can also be realized as a printed circuit board. The invention can also be realized as a coplanar waveguide. The invention can also be implemented in MMIC.

In one preferred development of the invention, the power circuit is used as a power divider. In this development, the first port is an input port, and the second and third ports are output ports. This also defines the port impedance of the first port to be an input impedance, and the port impedances of the second and third ports to be output impedances. In another development of the invention, the power circuit is used as a power combiner. In this development, the second and third ports are input ports, and the first port is an output port. This also defines the port impedances of the second and third ports to be input impedances, and the port impedance of the first port to be an output impedance.

The object of the invention is also achieved by a power circuit system according to the invention, said system comprising at least a first and a second power circuit according to the invention. This is realised by connecting the second or third port of the first power circuit to the first port of the second power circuit. This has the advantage of allowing power combination or power division among additional ports. Additional number of circuits can be used, such e.g. if a first power circuit is connected to a second and a third power circuit by connecting the second and third ports of the first power circuit to the first port of the second and third power circuits, a power circuit system is realized which could combine or divide power into or amongst four ports respectively. Further, the circuits could be connected such that only one of the second and third ports of the first power circuit is connected to a second power circuit, while the other of the second and third ports is connected to a different component. This could provide e.g. unequal power division, or a suitable measuring point.

The invention also relates to an antenna array, which comprises a power circuit according to the disclosure.

BRIEF DESCRIPTION OF THE DRAWINGS

FIG. 1 shows a schematic image of a power circuit according to the invention,

FIG. 2 shows a power circuit according to the invention where the number of stepped impedance subsections and the number of pairs of core subsections are equal to three.

DETAILED DESCRIPTION

Figure 3:
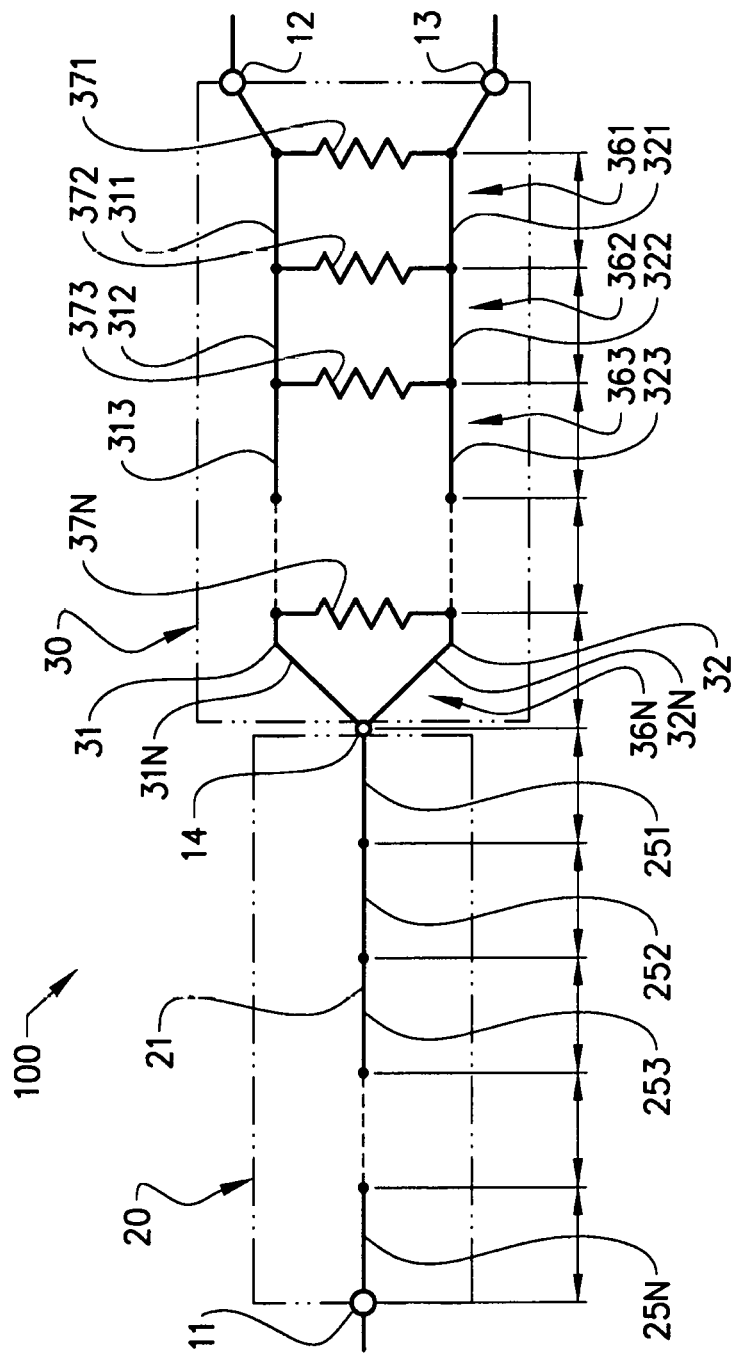
FIG. 3 shows a power circuit according to the invention where the number of stepped impedance subsections and the number of pairs of core subsections are equal to N.

Various aspects of the disclosure will hereinafter be described in conjunction with the appended drawings to illustrate and not to limit the disclosure, wherein like designations denote like elements, and variations of the described aspects are not restricted to the specifically shown embodiment, but are applicable on other variations of the disclosure.

FIG. 1 shows a schematic image of a power circuit 10 according to the invention. The power circuit 10 has a first port 11, a second port 12 and a third port 13. The power circuit 10 has port impedances $Z_0$. The power circuit 10 has a stepped impedance section 20 and a core section 30 interconnected at an interconnection 14. The stepped impedance section 20 comprises the first port 11 and a first transmission line 21 running from the first port 11 to the interconnection 14. The core section 30 comprises the second and third ports 12, 13, a second transmission line 31 which runs from the interconnection 14 to the second port 12 and a third transmission line 32 which runs from the interconnection 14 to the third port 13. The core section 30 also comprises resistance means which connect the second and third transmission lines 31, 32.

FIG. 2 shows a power circuit 10 according to the invention. In the example shown in FIG. 2, the power circuit 10 is used as a power divider. The power divider 10 has a first port 11, a second port 12 and a third port 13. The first port of the power divider has an input impedance $Z_0$ and the second and third ports have output impedances $Z_0$. The power divider comprises a stepped impedance section 20, and a core section 30. The stepped impedance section 20 and the core section 30 are interconnected at an interconnection 14. The stepped impedance section 20 comprises the first port 11, and a first transmission line 21 which runs from the first port 11 to the interconnection 14.

The core section 30 comprises the second and third ports 12, 13, and a second and third transmission line 31, 32. The second transmission line 31 runs from the interconnection 14 to the second port 12, and the third transmission line 32 runs from the interconnection to the third port 13. The second and third transmission lines 31, 32 have three core subsections each. The second transmission line 31 has three core subsections 311, 312, 313 and the third transmission line 32 also has three core subsections 321, 322, 323. The number of core subsections of the second and third transmission lines 31, 32 is preferably equal. The core subsections each have an impedance Z. The core subsections form three pairs 361, 362, 363 of core subsections, where the first pair 361 of core subsections comprises the first core subsection 311 of the second transmission line 31, and the first core subsection 321 of the third transmission line 32, the second pair 362 of core subsections comprises the second core subsection 312 of the second transmission line 31 and the second core subsection 322 of the third transmission line 32 and the third pair 363 of core subsections comprises the third core subsection 313 of the second transmission line 31 and the third core subsection 323 of the third transmission line 32. Each pair of core subsections comprises resistance means 371, 372, 373 connecting the core subsections of each pair. As illustrated in FIG. 2, the core subsections that make up a pair of core subsections are located at essentially the same location on their respective transmission lines 31, 32. The resistance means of the pair is connected to the transmission lines 31, 32 at the end of the core subsections closest to the output ports. The power circuit is advantageously symmetrical in its structure.

The first transmission line 21 comprises three stepped impedance subsections 251, 252, 253 where each stepped impedance subsection has an impedance $Z_{T1}, Z_{T2}, Z_{T3}$. The impedance $Z_{T1}, Z_{T2}, Z_{T3}$, of each of the stepped impedance subsections differs. The number of stepped impedance subsections, and the number of pairs of core subsections is preferably equal. The impedances $Z_{T1}$, $Z_{T2}$, $Z_{T3}$ of each of the stepped impedance subsections 251, 252, 253 preferably decrease stepwise from first port 11 towards the interconnection 14. The impedances $Z_{T1}$, $Z_{T2}$, $Z_{T3}$ of the first transmission line 21 in each of the stepped impedance subsections 251, 252, 253 are less than the input and output impedances $Z_0$, and are also greater than half of the input and output impedances $Z_0$. These relationships yield the relationship as follows:

$$\frac{Z_0}{2} < Z_{T1} < Z_{T2} < Z_{T3} < Z_0;$$

$$\forall (Z_{T1}, Z_{T2}, Z_{T3}) \in \left\{\frac{Z_0}{2}, Z_0\right\}$$

The core subsections 311, 312, 313, 321, 322, 323 of each pair 361, 362, 363 of core subsections have equal impedance Z. Further, each pair of core subsections has equal impedance. Thus, the first pair 361 has the same impedance $Z_1$ in both of the core subsections 311, 321 of the pair 361, the second pair 362 has the same impedance $Z_2$ in both of the core subsections 312, 322 of the pair 362 and the third pair 363 has the same impedance $Z_3$ in both of the core subsections 313, 323 of the pair 363, and further, all the impedances $Z_1$, $Z_2$, $Z_3$ of each of the pairs of core subsections of the second and third transmission lines 31, 32 are all equal. The impedances $Z_1$, $Z_2$, $Z_3$ of each of the pairs of core subsections of the second and third transmission lines 31, 32 are all equal to the associated input and output impedances $Z_0$ of the power divider. The impedances $Z_1$, $Z_2$, $Z_3$ of each of the pairs of core subsection of the second and third transmission lines 31, 32 and the associated input and output impedances $Z_0$ of the power divider are equal to 50 Ohms. This relationship yields the relationship as follows:

$Z_1 = Z_2 = Z_3 = Z_0 = 50$ Ohms[Ω]

50 Ohms is used in this example, but it is also possible to design the power circuit 10 for other input and output impedances $Z_0$ such as e.g. 25, 30, 60, 70 or 90.

The resistances $R_1$, $R_2$, $R_3$ of each of the resistance means 371, 372, 373 connecting the second and third transmission lines 31, 32 differs. The resistances $R_1$, $R_2$, $R_3$ of each of the resistance means decrease from the second and third ports 12, 13 towards the interconnection 14. This yields the relationship as follows:

$R_3 < R_2 < R_1$

The power circuit 10 is reciprocal. Depending on what the ports 11, 12, 13 are connected to, the power circuit may be used as either a power divider or a power combiner. Using the first port 11 as an input port and the second and third ports 12, 13 as output ports, a power divider is formed dividing power inputted in the first port 11 between the second and third ports 12, 13, as shown in the example according to FIG. 2. In a further example, the power circuit is used as a power combiner, by using the second and third ports 12, 13 as input ports and the first port 11 as an output port, combining the power inputted in the second and third ports 12, 13 and outputting the combined power at the first port 11.

FIG. 3 shows a power circuit 100 according to the invention. The power circuit 100 shown in FIG. 3 is similar in structure to the power circuit 10 shown in FIG. 2 and discussed above. The power circuit is in this example a power divider. The power divider has a first port 11, a second port 12 and a third port 13. The first port of the power divider has an input impedance $Z_0$ and the second and third ports have output impedances $Z_0$. The power divider comprises a stepped impedance section 20, and a core section 30. The stepped impedance section 20 and the core section 30 are interconnected at an interconnection 14. The stepped impedance section 20 comprises the first port 11, and a first transmission line 21 which runs from the first port 11 to the interconnection 14.

The core section 30 comprises the second and third ports 12, 13, and a second and third transmission line 31, 32. The second transmission line 31 runs from the interconnection 14 to the second port 12, and the third transmission line 32 runs from the interconnection to the third port 13. The second and third transmission lines 31, 32 have N number of core subsections each. The second transmission line 31 has N number of core subsections 311, 312, 313, 31N and the third transmission line 32 also has N number of core subsections 321, 322, 323, 32N. The number of core subsections of the second and third transmission lines 31, 32 is preferably equal. The core subsections each have an impedance Z. The core subsections form N pairs 361, 362, 363, 36N of core subsections, where the first pair 361 of core subsections comprises the first core subsection 311 of the second transmission line 31, and the first core subsection 321 of the third transmission line 32, the second pair 362 of core subsections comprises the second core subsection 312 of the second transmission line 31 and the second core subsection 322 of the third transmission line 32 and the third pair 363 of core subsections comprises the third core subsection 313 of the second transmission line 31 and the third core subsection 323 of the third transmission line 32, and where the N-th pair of core subsections comprises the N-th core subsection 31N of the second transmission line and the N-th core subsection 32N of the third transmission line. Each pair of core subsections comprises N resistance means 371, 372, 373, 37N connecting the core subsections of each pair. As illustrated in FIG. 2, the core subsections that make up a pair of core subsections are located at essentially the same location on their respective transmission lines 31, 32. The resistance means of the pair of core subsections is connected to the transmission lines 31, 32 at the end of the core subsections closest to the output ports. The power circuit is advantageously symmetrical in its structure.

The first transmission line 21 comprises N number of stepped impedance subsections 251, 252, 253 where each stepped impedance subsection has an impedance $Z_{T1}$, $Z_{T2}$, $Z_{T3}$, $Z_{TN}$. The impedance $Z_{T1}$, $Z_{T2}$, $Z_{T3}$, $Z_{TN}$ of each of the stepped impedance subsections differs. The impedances $Z_{T1}$, $Z_{T2}$, $Z_{T3}$, $Z_{TN}$ of each of the stepped impedance subsections 251, 252, 253 preferably decrease stepwise from first port 11 towards the interconnection 14. The impedances $Z_{T1}$, $Z_{T2}$, $Z_{T3}$, $Z_{TN}$ of the transmission line 21 in each of the stepped impedance subsections 251, 252, 253 are less than the input and output impedances $Z_0$, and also greater than half of the input and output impedances $Z_0$.

FIG. 3 shows a power circuit 100 where the number of stepped impedance subsections of the stepped impedance section 20 and the number of pairs of core subsections of the core section 30 is equal to N. This changes the relevant mathematical relationships to:

$$\frac{Z_0}{2} < Z_{T1} < Z_{T2} < Z_{T3} < \ldots < Z_{TN} < Z_0;$$

$$\forall (Z_{T1}, Z_{T2}, Z_{T3}, \ldots, Z_{TN}) \in \left\{\frac{Z_0}{2}, Z_0\right\}$$

-continued $$Z_1 = Z_2 = Z_3 = \ldots = Z_N = Z_0 = 50 \text{ Ohms } [\Omega]$$

$$R_N < \ldots < R_3 < R_2 < R_1$$

The power circuit 100 is reciprocal and may be used as either a power divider or a power combiner. In the example discussed and shown in FIG. 3, the power circuit 100 is a power divider. Instead using the second and third ports 12, 13 as input ports and the first port 11 as an output port, the power circuit 100 may be used as a power combiner.

The impedances $Z_{T1}$, $Z_{T2}$, $Z_{T3}$, ..., $Z_{TN}$ of the first transmission line 21 can be synthesised using any appropriate synthesizing equations or filters such as e.g. Butterworth, Chebyshev, Cauer or Bessel equations or filters. Most suitable for this application are Chebyshev equations also called Chebyshev transforms, and preferably, the order of Chebyshev transforms is equal to the number of pairs of core subsections. Preferably, the power circuit has a coupling factor of −3.0 dB, i.e. equal power split.

While the examples described in the above disclose circuits where the number of stepped impedance subsections, and the number of pairs of core subsections are equal to three or more, for some applications it is sufficient to use a circuit with two stepped impedance subsections, and two pairs of core subsections. Thus the invention relates to a power circuit comprising at least two stepped impedance subsections and at least two pairs of core subsections.

The power circuits shown in FIGS. 2 and 3 are preferably implemented in stripline, but other implementations are also possible such as in microstrip, coplanar waveguide, through discrete components on a printed circuit board, etc. In certain implementations such as e.g. stripline, designing the power circuit 10 for input and output impedances $Z_0$ of 70 Ohms or above is difficult. Thus input and output impedances $Z_0$ of less than 70 Ohms is preferred.

Preferably, the circuit is used for broadband signals with a frequency in the range between 4 and 20 GHz as an example. As the number of stepped impedance subsections and pairs of core subsections increase, the bandwidth increases.

Preferably, the length of each of the stepped impedance subsections and the length of each of the core subsections is equal to a quarter of the wavelength of the center frequency of the power circuit.

Figure 4:
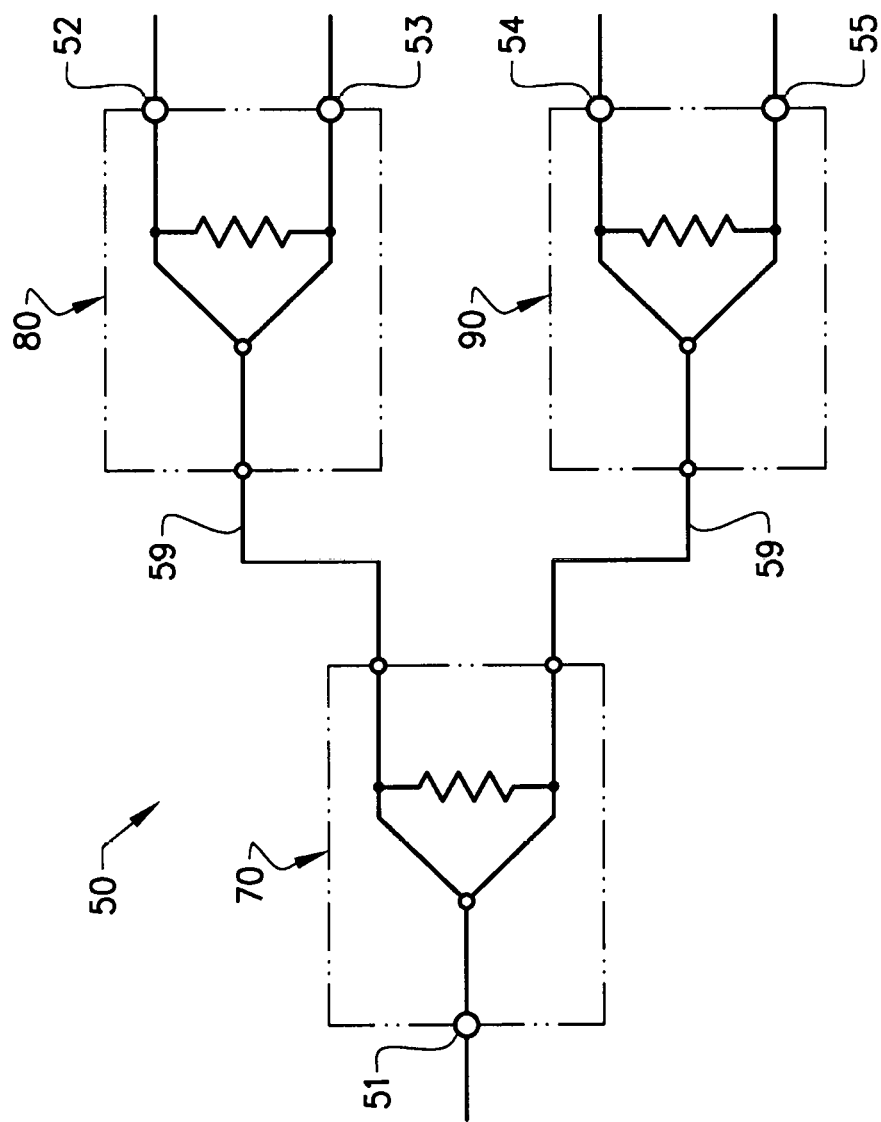
FIG. 4 shows a schematic image of a power circuit system according to the invention.

FIG. 4 shows a schematic image of a power circuit system 50 according to the invention. The power circuit system 50 comprises a first 70, a second 80, and a third 90 power circuit corresponding to the power circuit 10 according to the invention. The second and third ports of the first power circuit 70 are connected to the first port of the second and the third power circuits 80, 90 respectively by means of connecting transmission lines 59. In this example, the power circuit system is a 1:4 power dividing system, wherein the first port of the first circuit is used as an input port and the second and third ports of the second and third power circuits are used as output ports. The power circuit system has an input port 51, and output ports 52, 53, 54, 55. The input port 51 of the power circuit system is the same as the first port of the first power circuit, and the output ports of the power circuit system are the same as the second and third ports of the second and third power circuits. The connecting transmission lines have an impedance $Z_0$. When implementing the power circuit system 50 in a stripline, microstrip, coplanar waveguide or the like, the connecting transmission lines 59 preferably have a length equal to a quarter wavelength of the center frequency of the circuit multiplied by a coefficient k. The coefficient k is preferably an uneven number which depends on numerical analysis of the circuit, especially influenced by the number of stepped impedance subsections and pairs of core subsections. For a power system with three power circuits, k is preferably equal to three. This value of k will result in good matching at the ports of the power circuit system, especially the input port. In another example, the power circuit system is instead used as a 4:1 power combining system, wherein the second and third ports of the second and third power circuits are used as input ports and the first port of the first circuit is used as an output port.

The power circuit system may be constructed in other variants as well to meet other requirements of the system. The power circuit system may include additional power circuits connected to the to achieve a different 1:M or M:1 power division or power combination respectively. The power circuit system may also include a number of power circuits with unequal power division or power combination, allowing for other combinations. M will most often be an even number. A power circuit system may comprise both power circuits used as power dividers and power circuits used as power combiners to achieve a desired 1:M or M:1 power division or power combination.

The power circuits used in the power circuit system may be any power circuit according to the invention such as e.g. the one described in FIG. 2 or the one described in FIG. 3.

The power circuit and power circuit system can be implemented in an antenna array for use e.g. in radio applications requiring signal transmission in several channels.

The invention claimed is:

1. A power circuit suitable for combining or splitting broadband signals, the circuit comprising:
   a stepped impedance section,
   a core section and
   a first, second and third port,
   an interconnection at which said stepped impedance section and said core section are interconnected,
   wherein said stepped impedance section comprises the first port and a first transmission line running from said first port to said interconnection, and wherein said core section comprises the second port and the third port, and a second transmission line running from said interconnection to the second port and a third transmission line running from said interconnection to the third port, and wherein the second and third transmission lines each have at least a first and a second core subsection, wherein the number of core subsections of the second transmission line and the number of core subsections of the third transmission line is equal, each core subsection having a line impedance, said core subsections forming at least two pairs of core subsections, wherein the first pair of core subsections comprises the first core subsection of the second transmission line and the first core subsection of the third transmission line and the second pair of core subsections comprises the second core subsection of the second transmission line and the second core subsection of the third transmission line, and each pair of core subsections comprises a resistance module connecting the core subsections,
   wherein the first transmission line comprises at least two stepped impedance subsections, each stepped impedance subsection having a line impedance, and where the line impedances of the at least two stepped impedance subsections differs, and wherein the line impedances of each core subsection of said second and third transmission lines are equal, and the resistance of each of the resistance module connecting said second and third transmission lines in each pair of core subsections differs, and wherein the number of stepped impedance subsections of the stepped impedance section is equal to the number of pairs of core subsections of the core section.

2. The power circuit according to claim 1, wherein the line impedances of each of the stepped impedance subsections decrease stepwise from the first port towards the interconnection.

3. The power circuit according to claim 1, wherein the line impedances of each of the stepped impedance subsections are less than the port impedances of the first, second and third ports.

4. The power circuit according to claim 1, wherein the line impedances of each of the stepped impedance subsections are greater than half of the port impedances of the first, second and third ports.

5. The power circuit according to claim 1, wherein the resistances of the resistance module of the core section decreases from the second and third ports towards the interconnection.

6. The power circuit according to claim 1, wherein the number of stepped impedance subsections of the stepped impedance section and the number of pairs of core subsections of the core section are both equal to three.

7. The power circuit according to claim 1, wherein the line impedances of the core subsections of the core section is equal to the port impedances of the first, second and third ports.

8. The power circuit according to claim 1, wherein the line impedances of the core subsections of the core section is equal to 50 Ohms.

9. The power circuit according to claim 1, wherein said broadband signals have a frequency in the range between 4 and 20 GHz.

10. The power circuit according to claim 1, wherein the first port is an input port and the second and third ports are output ports, forming a power divider.

11. The power circuit according to claim 1, wherein the second and third ports are input ports and the first port is an output port, forming a power combiner.

12. The power circuit according to claim 1, wherein said power circuit is implemented on a substrate.

13. The power circuit according to claim 12, wherein each stepped impedance subsection of said stepped impedance section and each core subsection of the core section have a length equal to a quarter wavelength of the center frequency of the power circuit.

14. The power circuit according to claim 1, wherein said power circuit is implemented using printed circuit board technology.

15. A power circuit system, the power circuit system comprising:

at least a first and a second power circuit according to claim 1, wherein the second port of the first power circuit is connected to the first port of the second power circuit.

16. The power circuit system according to claim 15, further comprising:

a third power circuit, wherein the third port of the first power circuit is connected to the first port of the third power circuit.

17. The power circuit according to claim 15, wherein M number of power circuits are connected to form a 1 to M+1 power circuit system or an M+1 to 1 power circuit system.

18. The power circuit according to claim 15, wherein the power circuits are connected by connecting transmission lines.

19. The power circuit according to claim 18, wherein the connecting transmission lines have a length equal to a quarter wavelength of the center frequency of the power circuits of the power circuit system multiplied by a coefficient k.

20. An antenna array, comprising a power circuit according to claim 1.

* * * * *